(12) United States Patent
Kim et al.

(10) Patent No.: US 6,982,223 B2
(45) Date of Patent: Jan. 3, 2006

(54) METHOD OF MANUFACTURING A SEMICONDUCTOR DEVICE

(75) Inventors: Ju-Wan Kim, Seoul (KR); Shin-Hye Kim, Yongin-si (KR); Ju-Bum Lee, Yongin-si (KR); Hyong-Soo Kim, Suwon-si (KR)

(73) Assignee: Samsung Electronics, Co., Ltd., Suwon (KR)

( * ) Notice: Subject to any disclaimer, the term of this patent is extended or adjusted under 35 U.S.C. 154(b) by 44 days.

(21) Appl. No.: 10/413,944

(22) Filed: Apr. 15, 2003

(65) Prior Publication Data

US 2004/0038516 A1    Feb. 26, 2004

(30) Foreign Application Priority Data

Aug. 2, 2002    (KR) ............................... 2002-45897

(51) Int. Cl.
  *H01L 21/4763*    (2006.01)
  *H01L 21/31*    (2006.01)
(52) U.S. Cl. .................. 438/632; 438/652; 438/760; 438/778; 438/792
(58) Field of Classification Search ............... 438/587, 438/652, 632, 760, 778, 792
  See application file for complete search history.

(56) References Cited

U.S. PATENT DOCUMENTS

| 5,652,187 | A | * | 7/1997 | Kim et al. ............... 438/760 |
| 5,872,064 | A | * | 2/1999 | Huff et al. .............. 438/778 |
| 5,962,344 | A | * | 10/1999 | Tu et al. ................. 438/694 |
| 6,159,870 | A | * | 12/2000 | Chakravarti et al. ..... 438/784 |
| 6,165,897 | A | * | 12/2000 | Jang ........................ 438/637 |
| 6,174,808 | B1 | * | 1/2001 | Jang et al. .............. 438/680 |
| 6,175,808 | B1 | * | 1/2001 | Chai ........................ 702/4 |
| 6,562,714 | B1 | * | 5/2003 | Lee ........................ 438/637 |

FOREIGN PATENT DOCUMENTS

KR    KO 99024553    4/1999

* cited by examiner

*Primary Examiner*—Hsien-Ming Lee
(74) *Attorney, Agent, or Firm*—F. Chau & Associates, LLC

(57) ABSTRACT

A method of manufacturing a semiconductor device by which a generation of a void is prevented after depositing an interlayer dielectric material. First, a plurality of conductive patterns are formed on a substrate and then, a capping insulation layer is formed on the conductive patterns. The capping insulation layer is treated with plasma, and an interlayer dielectric material is deposited on the plasma treated capping insulation layer. The dependency of the interlayer dielectric on the type of material and form of an underlying layer is reduced to improve a gap-filling characteristic, especially for a gap having a high aspect ratio. An improved gap-filling characteristic is accomplished and the formation of all or substantially all of the voids from forming in a gap is prevented even though an interlayer dielectric is deposited under a conventional deposition conditions.

13 Claims, 5 Drawing Sheets

METHOD OF MANUFACTURING A SEMICONDUCTOR DEVICE

TECHNICAL FIELD OF THE INVENTION

The present invention generally relates to a method of manufacturing a semiconductor device. More particularly, the present invention relates to a method of manufacturing a semiconductor device which prevents the formation of a void within a gap formed according to the shape of an underlying layer after depositing an interlayer dielectric material.

BACKGROUND OF THE INVENTION

There has been significant progress in the development of semiconductor devices due to the widespread use of information media such as computers. Design requirements typically require that semiconductor devices function at higher operating speeds and have larger storage capacitance. To satisfy such requirements, semiconductor devices with increased density, reliability, and response time continuously are under development. To manufacture a highly integrated semiconductor device, reduction in cell size is essential, which leads to reducing the size and margin of every pattern formed on a substrate. In addition, the vertical size of a semiconductor device, that is, an aspect ratio of elements forming the device, has also increased.

The design rule of recently developed and highly integrated semiconductor devices has decreased to about 0.15 $\mu$m. As a result, the size of contact holes that provide an electrically connecting portion with a silicon substrate has gradually decreased, and the BC processing margin for an electric connection of a storage node with a source/drain region of a transistor has been largely limited. Recently, a self-aligning method has been used to ensure the BC processing margin and a spacer has been employed on the sidewall portion of a gate electrode to prevent a connection of the gate electrode with the storage node. The application of the self-aligning method and the spacer further narrows the gap distance (or the gap width) of the contact hole.

FIGS. 1A–1C are cross-sectional views illustrating a conventional method wherein voids are formed within a gap of a BPSG layer.

Referring to FIG. 1A, a semiconductor substrate 100 such as a silicon substrate is separated into an active region and a field region by a field oxide layer 110 having a thickness of 800 Å to 2000 Å. On the active region, a gate 170 including a first oxide pattern 121, a first conductive pattern 131, a second conductive pattern 141, an insulation layer pattern 151, a second oxide layer pattern 161, and a spacer 180 formed on a side wall portion of the gate 170, is provided. Further, on the field oxide layer 110, a gate 170, as shown in FIGS. 1A–1C, including a first conductive pattern 131, a second conductive pattern 141, an insulation layer pattern 151, a second oxide layer pattern 161, and a spacer 180 formed on a side wall portion of the gate 170, is provided.

The manufacturing process of the patterns illustrated in FIG. 1A is as follows. First, a first oxide layer, that is, a gate oxide layer is formed on the active region of the semiconductor substrate 100 by a thermal oxidation method. Then, a conductive layer and an insulation layer are subsequently formed. The conductive layer is preferably formed by using impurity-doped polysilicon having a conductivity, or polycide. A polycide layer includes a first conductive layer of a doped polysilicon layer having a thickness of 800 Å to 1200 Å and a second conductive layer of a refractive metal silicide layer having a thickness of about 1300 Å to about 1700 Å. As for the examples of refractive metal silicide layer, tungsten silicide layer ($WSi_x$), tantalum silicide layer ($TaSi_2$), titanium silicide layer ($TiSi_2$), cobalt silicide layer ($CoSi_2$), molybdenum silicide layer ($MoSi_2$), and the like.

The insulation layer is preferably formed as a silicon nitride layer, which has a higher etch selectivity than an oxide layer. The silicon nitride layer is formed by depositing a nitride compound such as silicon nitride (SiN) to a thickness of 800 Å to 1200 Å by means of a plasma enhanced chemical vapor deposition method (PE-CVD). The insulation layer passivates the conductive layer during subsequently implemented etching and ion implantation processes.

Thereafter, a second oxide layer is formed on the insulation layer. The second oxide layer is formed by depositing a hot temperature oxide (HTO), e.g., silicon oxide, to a thickness of 800 Å to 1200 Å by a low-pressure chemical vapor deposition (LPCVD) method. The second oxide layer functions an etch stop during an etching process for forming a spacer.

A photoresist layer is formed by coating a photoresist on the second oxide layer. Then, a photoresist pattern (not shown) is formed for manufacturing a gate electrode by a photolithography process. The second oxide layer, the insulation layer, the second conductive layer, the first conductive layer and the first oxide layer are continuously etched one by one using the photoresist pattern as an etching mask to form parallel gate patterns 170 while maintaining a given distance between neighboring patterns on a predetermined region of the substrate. Each of the gate patterns 170 includes a subsequently stacked structure of first and second conductive layer patterns 131 and 141, an insulating layer pattern 151, a second oxide layer pattern 161. The gate pattern 170 corresponds to the gate electrode.

Next, the spacer 180 is formed on the sidewall portion of the gate pattern 170. Silicon nitride is deposited on the semiconductor substrate 100 on which the gate pattern 170 is formed to a thickness of 1200 Å to form a silicon nitride layer (not shown). An etch-back process with respect to the silicon nitride layer is executed until the active region of the semiconductor substrate 100 is exposed to form the spacer 180. During etching to form the spacer 180, a surface portion of the semiconductor substrate is damaged. To repair the etching damage, a thermal oxidation layer is formed at a predetermined temperature. At this time, a thin thermal oxide layer is grown between the gate patterns 170 on the surface of the semiconductor substrate 100. Thus, the thermal oxidation layer is called a MTO (medium temperature oxide).

An ion implantation process is executed to form a source/drain region (not shown) between gate patterns 170 and onto the semiconductor substrate 100 by using the thin thermal oxide layer as a screen oxide layer. In order to implement the ion implantation, some of the region is masked to implant appropriate impurities into a desired region. Then, the impurities are implanted into the active region of the exposed semiconductor substrate 100, and a diffusion region of the source/drain of a transistor is formed. During the ion implantation, the gate electrode 170 and the spacer 180 formed at the sidewall portion of the gate electrode 160 function as a mask.

Referring to FIG. 1B, a capping insulation layer 190, e.g., a silicon nitride layer, is formed by a CVD method on the entire surface of the substrate after forming the spacer 180. The capping insulation layer 190 is thin and has a thickness of 50 Å to 150 Å and functions as an etch stop layer during subsequently implemented etching processes and prevents the penetration of impurities of an interlayer dielectric of a BPSG layer, e.g., B, P, etc. into the silicon substrate.

Referring to FIG. 1C, an interlayer dielectric 300 is formed on the capping insulation layer 190 using an interlayer dielectric material having a good gap filling characteristic. The interlayer dielectric 300 is formed by depositing the interlayer dielectric material having a good gap filling characteristic, e.g., silicon oxide, BPSG (borophosphosilicate glass), PSG (phosphosilicate glass), HDP (high density plasma) oxide, TEOS (tetraethylorthosilicate), etc., by using a low pressure chemical vapor deposition (LPCVD) method or a plasma enhanced chemical vapor deposition (PECVD) method, reflowing at a high temperature, and then planarizing the deposited interlayer dielectric material by using a planarizing method, e.g., a CMP process.

According to the method of forming the interlayer dielectric layer as described above, a gap 192, as shown in FIG. 1B, having a high aspect ratio can also be easily filled with the interlayer dielectric material because the interlayer dielectric material has a good reflowing characteristic. In addition, the interlayer dielectric does detach from an underlying layer because of the application of the plasma CVD method, which adheres the interlayer dielectric material to the underlying layer with a sufficient adhesive strength. However, a void 301 can be formed within the gap 192 as the size of the gap 192 between patterns of the capping insulation layer is narrowed. Most of the voids 301 can be eliminated through a subsequently applied reflow process. When the void remains after a reflow process, the reliability of a contact deteriorates due to the generation of a polymer from residues within the void during the process of forming a contact hole. However, in order to form an interlayer dielectric having excellent layer characteristics, the formation of a void is preferably prevented during deposition of the interlayer dielectric material.

As semiconductor devices have become more highly integrated and the design rule of the devices decrease, the margin of an insulating distance between patterns has gradually reduced, and interlayer dielectric materials having greater gap filling characteristics are needed.

Currently, a self-aligning method is used for confirming a BC processing margin, and a spacer is formed on the sidewall portion of a gate to prevent a connection between a gate electrode and a storage note. However, the reduction of the design rule and the formation of the spacer further narrows the gap distance between the patterns. As a result, the formation of the voids during forming the BPSG layer becomes more frequent.

During the manufacturing of highly integrated devices, a lower heat budget is required. As a result, when the reflowing temperature of BPSG is lowered, the gap-filling characteristics of BPSG are decreased, thereby causing voids to form within the semiconductor device. In addition, when the concentration of boron and phosphorous is increased in the BPSG material, it improves the reflowing characteristic and increases the gap filling property of the BPSG material. However, when the concentration of boron and/or phosphorous is increased in the BPSG material, the BPSG layer becomes weak to a subsequently applied wet cleaning process. In other words, a BPSG layer with a high concentration of boron and/or phosphorous forms a bridge between neighboring contacts. Accordingly, the concentration of boron and/or phosphorous cannot be increased excessively.

To improve the gap filling property of BPSG, a method of raising the reflowing temperature or lengthening the reflowing time can be applied. However, the methods of increasing the temperature and/or lengthening the reflowing time are not suitable because they aggravate the heat budget of the highly integrated devices.

There have been various methods proposed for filling a gap having a high aspect ratio. For instance, one such method is disclosed in U.S. Pat. No. 6,159,870 issued to Chakravarti et al., which discloses borophosphosilicate glass including fluorine for a low thermal budget gap fill. According to this patent, a gap having an aspect ratio of about 6:1 or greater can be filled with FBPSG (fluorinated borophosphosilicate glass) at a temperature of about 480° C. to form a void-free FBPSG film.

In addition, U.S. Patent Laid-Open Publication No. 2002/0052119 A1 (filed by Van Cleemput) discloses an in-situ flowing BPSG gap fill process using a high density plasma (HDP) deposition process to fill a gap having a high aspect ratio.

According to the above-described conventional methods, a narrow gap could be advantageously filled. However, the methods contain additional steps and/or features which increase the manufacturing costs for manufacturing highly integrated semiconductor devices. Therefore, a novel method for substantially filling a gap having a higher aspect ratio without significantly raising manufacturing costs is needed.

SUMMARY OF THE INVENTION

The present invention provides a method of manufacturing a semiconductor device which fills a gap and prevents the formation of all or substantially all of the voids from forming within a gap while depositing an interlayer dielectric material.

Another embodiment of the present invention provides a method of manufacturing a highly integrated semiconductor device by improving the gap filling characteristic of an interlayer dielectric by plasma treating the underlying layer, which reduces an interlayer dielectric dependency on the type of material and form of a underlying layer used in manufacturing a semiconductor device, before subsequently depositing an interlayer dielectric material.

Still another embodiment of the present invention provides a method of manufacturing a semiconductor device by forming a plurality of conductive patterns on a substrate, and forming a capping insulation layer on the conductive patterns. Then, treating the capping insulating layer with plasma. Finally, depositing an interlayer dielectric material on the plasma treated capping insulation layer.

Preferably, the methods are applied for filling a gap having an aspect ratio (depth: width) of about 10:1 or greater. More particularly, the methods are applied for a gap having an aspect ratio in a range of about 10:1 to about 42:1. In addition, $N_2$, $NH_3$, Ar, $H_2$, $N_2O$ etc., or any combination thereof can be used in the plasma treatment of an underlying layer.

Examples of the preferred interlayer dielectric material include BPSG (borophosphosilicate glass), PSG (phosphosilicate glass), TEOS (tetraethyl ortho silicate) and HDP (high density plasma) oxide. These can be used alone or in any combination thereof. More preferably, BPSG or PSG is used.

Another embodiment of the present invention provides a method of manufacturing a semiconductor device as follows. First, a plurality of gate patterns including a first insulation layer pattern, a conductive layer pattern and a second insulation layer pattern, are formed on a substrate.

Then, a spacer of an insulating material is formed on a sidewall portion of the gate pattern. Next, a capping insulation layer is formed on thus obtained product. Then, the capping insulation layer is treated with plasma. And finally, an interlayer dielectric material is deposited on the plasma treated capping insulation layer.

According to the present invention, a plasma treatment is implemented on an underlying layer before subsequently depositing an interlayer dielectric material, which improves the conformal step coverage of an interlayer dielectric material and removes the dependency of an interlayer dielectric material has on the type of material of and the form an underlying layer, that improves the gap filling characteristics of an interlayer dielectric material and prevents the formation of all or substantially all of the voids from forming within a gap.

BRIEF DESCRIPTION OF THE DRAWINGS

The above and other objects and advantages of the present invention will become readily apparent by reference to the following detailed description when considered in conjunction with the accompanying drawings wherein.

DETAILED DESCRIPTION OF PREFERRED EMBODIMENTS

FIGS. 2A–2D are cross-sectional views illustrating a method of manufacturing a semiconductor device in accordance with an embodiment of the present invention wherein a void-free gap is formed in a BPSG layer. A preferred embodiment of the present invention will be described in detail referring to FIGS. 2A–2D. Preferably, BPSG is used as an interlayer dielectric material due to its reflowing and filling characteristics, which are needed to substantially fill a narrow space. However, other materials such as PSG may also be used as a gap filling material without any limitations.

Figure 2A:
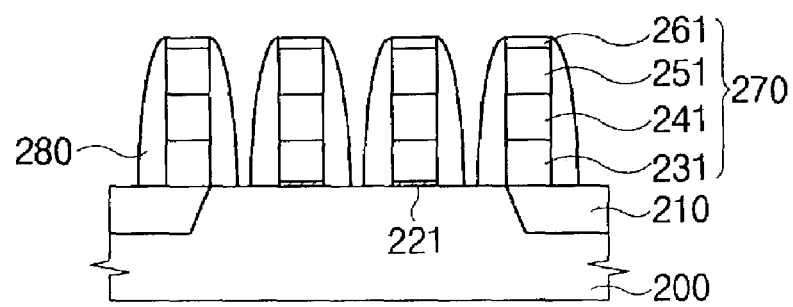
FIGS. 2A–2D are cross-sectional views illustrating a method of manufacturing a semiconductor device in accordance with an embodiment of the present invention, wherein a void-free gap is formed in a BPSG layer.

Referring to FIG. 2A, a semiconductor substrate 200, e.g., a silicon substrate, is defined into an active region and a field region by a field oxide layer 210 having a thickness of about 1800 Å to about 2000 Å. On the active region, gate patterns 270 are formed on a predetermined region of the substrate while maintaining a constant distance between neighboring patterns. The gate patterns 270 include a first oxide layer pattern 221 that is formed from a gate oxide layer formed on the active region of the silicon substrate by a thermal oxidation method, a first conductive layer pattern 231 that is formed from a doped polysilicon layer having a thickness of about 800 Å to about 1200 Å, a second conductive pattern 241 that is obtained from a refractive metal silicide layer having a thickness of about 1300 Å to about 1700 Å, an insulation layer pattern 251 formed from an insulation layer by depositing a nitride compound such as silicon nitride (SiN) by a plasma enhanced chemical vapor deposition (PECVD) method to a thickness of about 800 Å to about 1200 Å, and a second oxide layer pattern 261 formed from a second oxide layer formed by depositing a hot temperature oxide (HTO) such as silicon oxide by a low pressure chemical vapor deposition (LPCVD) method to a thickness of about 800 Å to about 1200 Å. A spacer 280 is formed on the sidewall portions of the gate pattern 270. Silicon nitride is deposited on the semiconductor substrate 200 on which the gate pattern 270 is formed to a thickness of about 1200 Å to form a silicon nitride layer (not shown). An etch-back process onto the silicon nitride layer is executed until the active region of the semiconductor substrate 200 is exposed to thereby form the spacer 280.

During the etching process for forming the spacer 280, the surface portion of the semiconductor substrate is damaged. To repair the damage, a thermal oxidation is grown at a predetermined temperature. At this time, a thin thermal oxide layer is grown between the gate patterns 270 on the surface of the semiconductor substrate 200. The grown thermal oxidation layer is called a MTO (medium temperature oxide).

An ion implantation process is performed to form a source/drain region (not shown) between gate patterns 270 on the semiconductor substrate 200 by using a thin thermal oxide layer as a screen oxide layer. To implement the ion implantation, some regions are masked to implant appropriate impurities into a desired region. Then, the impurities are implanted into the active region of the exposed semiconductor substrate 200 to form a diffusion region of the source/drain of a transistor. During the ion implantation, the gate electrode 270 and the spacer 280 formed at the sidewall portion of the gate electrode 270 function as a mask.

Figure 2B:
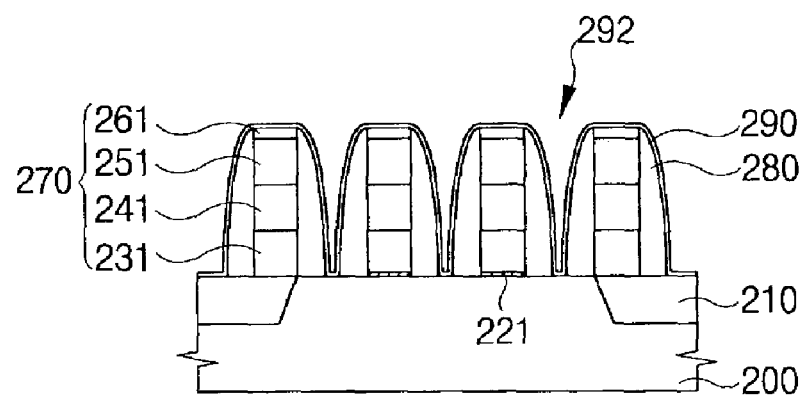

Referring to FIG. 2B, after forming the spacer 280, a capping insulation layer 290, e.g., a silicon nitride layer, is deposited by a CVD method on the entire surface of the substrate. The capping insulation layer 290 is formed to have a thickness of about 50 Å to about 150 Å and functions as an etch stop layer during subsequent etching processes. Further, the capping insulation layer prevents impurities of an interlayer dielectric of a BPSG layer, e.g., B, P, etc. from penetrating into the silicon substrate.

Figure 2C:
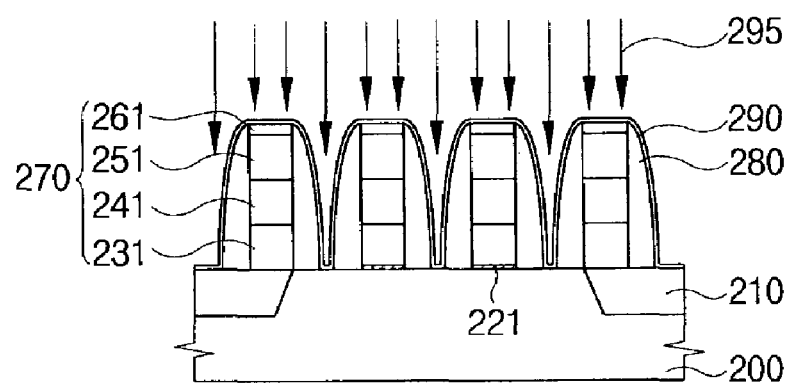

Referring to FIG. 2C, after forming the capping insulation layer 290, a plasma treatment (295) is performed before forming an interlayer dielectric. The plasma treatment (295) is performed using one of the following gases: $N_2$, $NH_3$, Ar, $H_2$, $N_2O$, etc. In addition, these gases can be in any combination thereof. To generate the plasma, any gas that can produce plasma can be used without any limitations. In a preferred embodiment, $NH_3$ gas is used.

The plasma treatment performed on the underlying layer reduces the dependency of a subsequently deposited interlayer dielectric material on the type of material and the form of the underlying layer. Generally, the type of material of the underlying layer influences the growth rate of the subsequently deposited layer. That is, the growth rate and the thickness of the subsequently formed layer are different based on the type of material used to form the underlying layer, e.g., SiN layer, silicon substrate, HTO, etc., even though the amount of material for forming the subsequently formed layer is the same. For example, when a sufficient amount of BPSG is deposited to form a layer having a thickness of about 4000 Å, the actual thickness of the BPSG layer may be about 2500 Å to about 4000 Å depending on the type of material used to form an underlying layer.

The depositing property of the subsequently formed layer is also dependent on the shape of the underlying layer. That is, the shape of the underlying layer does not effect the depositing when the subsequent layer is formed on a region of an underlying layer having a wide gap. On the other hand, the subsequent layer is formed thinner than expected on a region of the underlying layer having a small gap. Indeed, when the gap is small, the amount of reactive gas flowing in the small gap is reduced and a sufficient amount of gas is not provided into the small gap. Therefore, the subsequent layer on the region having a large gap is thicker than that on the region having a small gap. In conclusion, the growing characteristic of the subsequent layer is dependent on characteristics of the underlying layer.

Therefore, according to an embodiment of the present invention, after forming an underlying layer, the underlying layer is treated with plasma to reduce the dependency of a subsequently deposited on the type of material and the form of the underlying layer. The dependency is reduced because when the surface portion of the capping insulation layer is treated with plasma, or undergoes plasma treatment, new bonding sites are formed to facilitate bonding with a subsequently applied material. The new bonding sites are called "dangling bonds." For example, in a SiN layer, the bonds between Si atoms and N atoms are broken at the surface of the SiN layer to form dangling bonds, and the material deposited on the SiN layer forms a strong bond with the SiN layer at the dangling bonds. The bonding strength between the underlying layer and the subsequently deposited interlayer dielectric material is increased. As such, an interlayer dielectric material such as BPSG can be used to effectively fill a small gap 292, as shown in FIG. 2B, and form a rigid layer of interlayer dielectric material on the underlying layer. Advantageously, plasma treatment enables the interlayer dielectric material to effectively fill the gap 292 and prevent the formation of all (or substantially all) of the voids within the gap 292.

It is to be appreciated that plasma treatment may be performed using known methods, without any particular exception. For example, a plasma treatment under about 400 Watts of power, a flow rate of gas of about 100 sccm to about 2000 sccm, a pressure of about 2.6 Torr, and at a temperature of about 400° C. for about 60 seconds can be performed. Plasma treatments include the following flow rates. Preferred when $NH_3$ gas is used as the flowing gas, a flow rate of about 300 sccm is preferred. When a mixture of $N_2$ and $NH_3$ is used, a flow rate of about 1000 sccm to about 2000 sccm of $N_2$ gas and a flow rate of about 300 sccm of $NH_3$ gas, are preferably used. $NH_3$ is preferably used as the source gas for the plasma.

Figure 2D:
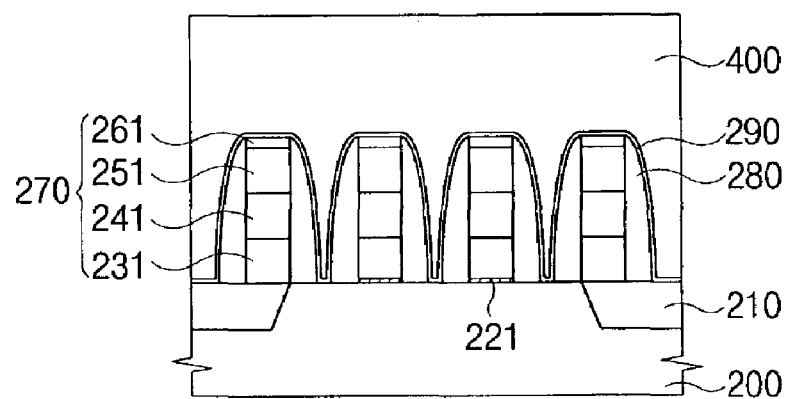

Referring to FIG. 2D, an interlayer dielectric 400 is formed on the capping insulation layer 290 using an interlayer dielectric material having a good gap filling characteristic. The interlayer dielectric 400 is formed by depositing an interlayer dielectric material such as silicon oxide, BPSG, PSG, HDP oxide, TEOS, etc., using a low pressure chemical vapor deposition method or a plasma enhanced chemical vapor deposition method. When the interlayer dielectric is formed according to the methods of the present invention, the methods prevent the formation of all or substantially all of the voids within a gap in an interlayer dielectric.

Through a plasma treatment as described above, a gap-filling is improved to prevent the formation of all or substantially all of the voids. In particular, when the plasma treatment is applied on a layer, e.g., a capping insulation layer as described above having a gap with an aspect ratio of about 10:1 or greater, the above effect is obtained. Typically, prevention of the formation of all or substantially all the voids is obtainable for a small gap having an aspect ratio of about 10:1 to about 42:1, as compared to the conventionally applied process. More particularly, the method of the present invention is advantageously applied on a layer having a gap with a depth of about 3500 Å to about 4200 Å and a width of about 100 Å to about 300 Å. With the conventional gap filling methods, the formation of the void is inevitable when filling a gap having a high aspect ratio. However, the formation of all or substantially all of the voids in a gap having a high aspect ratio can be prevented using methods described herein.

After depositing the interlayer dielectric material, a reflowing process is performed at a high temperature. Then, the deposited interlayer dielectric material is planarized using a planarizing method such as a CMP thereby forming an interlayer dielectric 400.

Preferably, BPSG includes B in a concentration of about 4.0% to about 5% by weight and more preferably about 4.75% by weight, and P in a concentration of about 3.5% to about 4.5% by weight and more preferably about 4.0% by weight. A preferred depositing temperature of BPSG is about 460° C. A preferred reflowing condition for removing the void is about 15 minutes at about 815° C. under a steam atmosphere (equilibrium state wherein vapor is formed by introducing $H_2/O_2$).

After forming the interlayer dielectric, a photoresist pattern having a predetermined shape is formed to pattern the planarized interlayer dielectric for forming a contact hole. The interlayer dielectric 400 is etched using the photoresist pattern as a mask to form an interlayer dielectric pattern and to expose a substrate between gate patterns, simultaneously. A self-aligned contact hole is formed through the etching and exposing of the source/drain region between gate patterns 270. The etching of the interlayer dielectric is preferably performed by using an etching apparatus having a high ionization degree and using a mixed gas having a high ratio of carbon/fluorine, e.g., $C_3F_8$, $C_4F_8$, CO, and the like. On the entire surface of the substrate on which the interlayer dielectric pattern including the contact hole is formed, a conductive material is deposited to form a contact or a storage electrode (not shown).

Figure 3A:
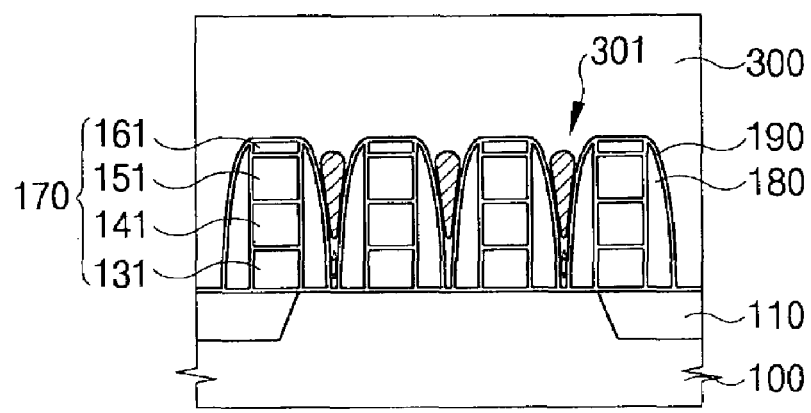
FIGS. 3A and 3B are cross-sectional views obtained by analyzing photographs taken after treating a semiconductor device with an LAL etching solution for 20 seconds after depositing a gap filling material.
Figure 3B:
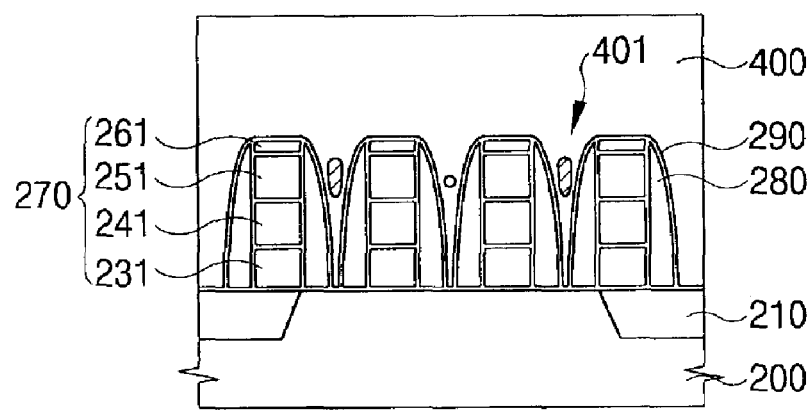

The effect of preventing the formation of the voids during the formation of the interlayer dielectric using methods of the present invention will be examined in comparison with conventional methods for forming an interlayer dielectric, with reference to FIGS. 3a and 3b.

FIGS. 3A and 3B are cross-sectional views depicting photographs taken after treating a semiconductor device with a LAL etching solution for 20 seconds after depositing a gap filling material. FIG. 3A depicts the results of depositing a gap filling material using a conventional method. FIG. 3B depicts the results of depositing a gap filling material using a method of the present invention. A LAL etching solution is prepared by mixing HF, $NH_4F$ and DI (deionized water) and is used as a wet etching solution. The LAL solution is then applied to the semiconductor device where it penetrates into cracks that have formed between different layers and through an integration of various materials. The LAL etching solution etches a contacting layer to widen the cracks. A SEM picture is taken of the semiconductor device where cracks and voids can be observed within the interlayer dielectric material of a semiconductor device. Above all, the LAL etching solution enlarges the void formed within the gap, which allows one to readily detect small voids.

Figure 1A:
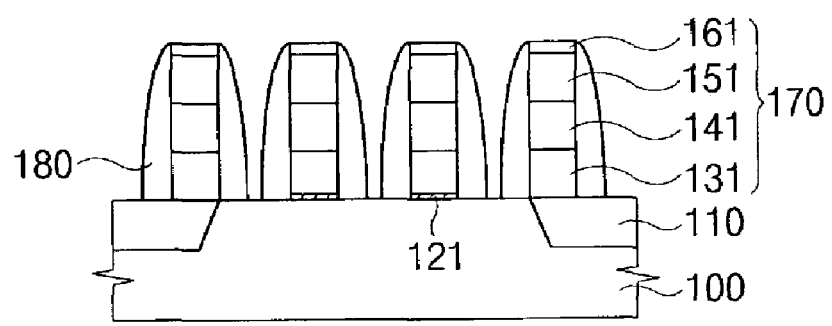
FIGS. 1A–1C are cross-sectional views illustrating a conventional method of filling gaps in a semiconductor device, wherein voids are formed within a gap of a BPSG layer.
Figure 1B:
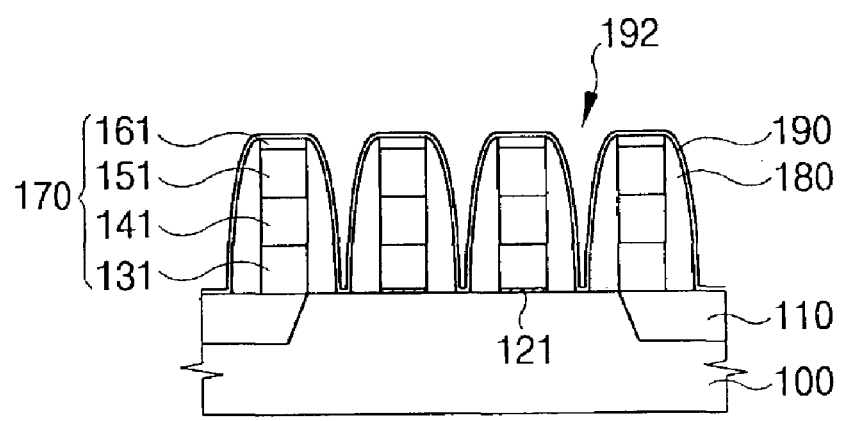
Figure 1C:
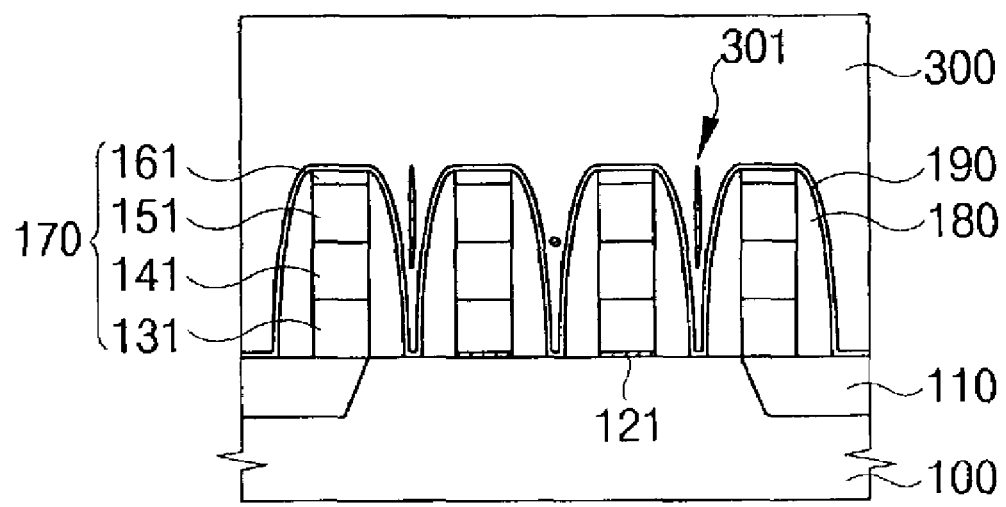

A SEM picture can be examined to determine whether or not a void has been formed within the interlayer dielectric material. When examining a vertical and cross-sectional picture, e.g., pictures as illustrated in FIGS. 1C and 2D are analyzed to confirm the formation of the voids, the portion where an oxide layer is formed displays black. The portion where a void is present within the interlayer dielectric material does not display black.

Referring to FIG. 3A, using a conventional method, large voids 301 were formed within almost all of the gaps after forming the interlayer dielectric 300 according to the conventional methods. On the contrary, referring to FIG. 3B, even though small voids 401 may be formed within the gaps after plasma treatment followed by forming the interlayer dielectric 400 according to a method of the present invention, the voids 401 illustrated in FIG. 3B are insignificant when compared with the voids 301 illustrated in FIG. 3A.

A plasma treatment according to the present invention can be separately implemented with the depositing process of the interlayer dielectric material as described above or can be implemented in-situ. When the plasma treatment and the depositing process of the interlayer dielectric are implemented in-situ, two typical methods can be applied. The plasma treatment might be readily executed through the in-situ manner.

According to a first method, an underlying layer is formed on a wafer inside a chamber, and then the wafer in the chamber is transferred to a plasma chamber by means of a robot arm for the subsequent plasma treatment of the underlying layer. A plasma treatment is performed in the plasma chamber on the wafer having an underlying layer thereon, and then the wafer is transferred back to the chamber for subsequently depositing an interlayer dielectric on the underlying layer and for implementing the remaining processes.

Alternately, plasma gas can be injected into a chamber for plasma treatment of an underlying layer before depositing an interlayer dielectric material, and then the interlayer dielectric can be deposited in-situ. A preferred plasma treatment temperature is about 400° C. to about 540° C. For BPSG, a preferred deposition temperature is about 460° C. and the plasma treatment temperature is about 400° C. The temperature of the plasma treatment can be increased to about 540° C. When the plasma treating temperature is raised, the dependency of the BPSG on the underlying layer is readily decreased. Accordingly, most preferably, the plasma treatment is implemented while the temperature within the chamber is set to about 540° C. and then BPSG is deposited in-situ to further improve the depositing characteristic of BPSG.

A method of forming the interlayer dielectric by applying the interlayer dielectric material after plasma treatment also can be applied for the manufacture of an STI (shallow trench isolation) structure as well as an ILD (interlayer dielectric) structure as described in the above embodiment.

As described above, the dependency of an interlayer dielectric on an underlying layer can be reduced by applying a plasma treatment before depositing the interlayer dielectric material to improve step coverage. Accordingly, gap filling of a gap having a high aspect ratio is improved.

In addition, the present invention can prevent the formation of all or substantially all of the voids within a gap by plasma treating an underlying layer and depositing a material having excellent gap filling characteristics, while maintaining the same depositing and reflowing conditions.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of manufacturing a semiconductor device comprising:
    forming a plurality of conductive patterns on a substrate;
    forming a capping insulation layer on said conductive patterns;
    plasma treating said capping insulation layer, wherein said capping insulation layer is a SiN layer, and wherein a gas used for said plasma treating comprises $NH_3$, Ar, $H_2$, or any combination thereof; and
    depositing an interlayer dielectric material on said plasma treated capping insulation layer and reflowing the interlayer dielectric material, wherein the plasma treating and reflowing substantially prevent formation of voids of the interlayer dielectric material in gaps between the conductive patterns.

2. A method of manufacturing a semiconductor device as claimed in claim 1, wherein an aspect ratio (depth:width) of the gaps formed between said capped conductive patterns is in a range of about 10:1 to about 42:1.

3. A method of manufacturing a semiconductor device as claimed in claim 1, wherein said interlayer dielectric material comprises BPSG (borophosphosilicate glass), PSG (phosphosilicate glass), TEOS (tetraethyl ortho silicate) or HDP (high density plasma) oxide.

4. A method of manufacturing a semiconductor device as claimed in claim 1, wherein the step of forming said conductive patterns comprises forming a spacer of an insulating material on a sidewall portion of said conductive patterns.

5. A method of manufacturing a semiconductor device as claimed in claim 1, wherein said plasma treating and said depositing of said interlayer dielectric material are implemented in-situ.

6. A method of manufacturing a semiconductor device as claimed in claim 1, wherein said plasma treating is performed with a temperature in a range of about 400° C. to about 540° C.

7. A method of manufacturing a semiconductor device comprising:
    forming a plurality of gate patterns on a substrate, said gate patterns including a first insulation layer pattern, a conductive layer pattern and a second insulation layer pattern;
    forming spacers of an insulating material on side wall portions of said gate patterns, respectively;
    depositing a capping insulation layer on said gate patterns;
    plasma treating said capping insulation layer, wherein said capping insulation layer is a SiN layer, and wherein a gas used for said plasma treating comprises $NH_3$, Ar, $H_2$, or any combination thereof; and
    depositing an interlayer dielectric material on said plasma treated capping insulation layer and reflowing the interlayer dielectric material, wherein the plasma treating and reflowing substantially prevent formation of voids of the interlayer dielectric material in gaps between the gate patterns.

8. A method of manufacturing a semiconductor device as claimed in claim 7, and wherein an aspect ratio (depth:width) of the gaps formed between said capped conductive patterns is in a range of about 10:1 to about 42:1.

9. A method of manufacturing a semiconductor device as claimed in claim 7, wherein said interlayer dielectric material comprises BPSG (borophosphosilicate glass), PSG (phosphosilicate glass), TEOS (tetraethyl ortho silicate) or HDP (high density plasma) oxide.

10. A method of manufacturing a semiconductor device as claimed in claim 7, wherein said plasma treating and said depositing of said interlayer dielectric material are implemented in-situ.

11. A method of manufacturing a semiconductor device as claimed in claim 10, wherein said plasma treating is performed with a temperature in a range of about 400° C. to about 540° C.

12. A method of manufacturing a semiconductor device comprising:

forming a plurality of conductive patterns on a substrate;

forming a capping insulation layer on said conductive patterns;

plasma treating said capping insulation layer, wherein said capping insulation layer is a SiN layer, and wherein the plasma treating comprises $NH_3$, Ar, $H_2$, or any combination thereof;

depositing an interlayer dielectric material on said plasma treated capping insulation layer and reflowing the interlayer dielectric material, wherein the plasma treating and reflowing substantially prevent formation of voids of the interlayer dielectric material in gaps between the conductive patterns; and forming a self-aligned contact hole in the interlayer dielectric, wherein an aspect ratio (depth:width) of the gaps formed between said capped conductive patterns is in a range of greater than 10:1 to about 42:1.

13. The method of manufacturing a semiconductor device as claimed in claim 12, wherein said interlayer dielectric material comprises BPSG (borophosphosilicate glass), PSG (phosphosilicate glass), TEOS (tetraethyl ortho silicate) or HDP (high density plasma) oxide.

* * * * *